United States Patent
Chen et al.

(10) Patent No.: US 6,432,786 B2
(45) Date of Patent: Aug. 13, 2002

(54) METHOD OF FORMING A GATE OXIDE LAYER WITH AN IMPROVED ABILITY TO RESIST THE PROCESS DAMAGE

(75) Inventors: Chi-Chun Chen, Kaohsiung; Horng-Chih Lin, Hsinchu; Chun-Yen Chang, Hsinchu; Tiao-Yuan Huang, Hsinchu, all of (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/829,498

(22) Filed: Apr. 9, 2001

(30) Foreign Application Priority Data

Aug. 10, 2000 (TW) .......................................... 089116120

(51) Int. Cl.$^7$ ...................... H01L 21/425; H01L 21/336
(52) U.S. Cl. ...................... 438/305; 438/303; 438/532
(58) Field of Search ................... 438/303, 305, 438/720, 232, 532

(56) References Cited

U.S. PATENT DOCUMENTS

| | | | | |
|---|---|---|---|---|
| 4,748,131 A | * | 5/1988 | Zietlow | 437/24 |
| 5,382,533 A | * | 1/1995 | Ahmad et al. | 437/24 |
| 5,571,734 A | * | 11/1996 | Tseng et al. | 437/40 |
| 5,599,726 A | * | 2/1997 | Pan | 437/41 |
| 5,605,848 A | * | 2/1997 | Ngaoaram | 437/24 |
| 5,712,208 A | * | 1/1998 | Tseng et al. | 438/770 |
| 5,714,788 A | * | 2/1998 | Ngaoaram | 257/411 |
| 5,780,330 A | * | 7/1998 | Choi | 438/232 |
| 5,831,319 A | * | 11/1998 | Pan | 257/408 |
| 2001/0039093 A1 | * | 11/2001 | Oohashi | 438/275 |

OTHER PUBLICATIONS

Wolf, Stanley "Sllicon Processing For The VLSI Era: vol. 1: Process Technology", pp. 181–183, Lattice Press, 1986.*
Wolf, Stanley "Silicon Processing For The VLSI Era: vol. 2: Process Integration", pp. 434–435, Lattice Press, 1990.*

* cited by examiner

Primary Examiner—Michael S. Lebentritt
(74) Attorney, Agent, or Firm—Christensen O'Connor; Johnson Kindess PLLC

(57) ABSTRACT

A method of forming a gate oxide layer with improved ability to resist process damage increases the reliability and yield of a transistor device. First, a nitrogen-containing gate oxide layer is formed on an element area of a silicon substrate. Then, a polysilicon layer is deposited on the gate oxide layer. Next, a gate doping process and a fluorine ion implantation are performed on the polysilicon layer. Then, a high-temperature tempering procedure is performed to make the fluorine enter the gate oxide layer.

11 Claims, 3 Drawing Sheets

METHOD OF FORMING A GATE OXIDE LAYER WITH AN IMPROVED ABILITY TO RESIST THE PROCESS DAMAGE

BACKGROUND OF THE INVENTION

1. Field of the Invention

The present invention relates to a method of fabricating integrated circuits, and more particularly, to a method of forming a gate oxide layer with an improved ability to resist process damage.

2. Description of the Prior Art

As the complementary metal-oxide semiconductor (CMOS) process enters a deep sub-micron epoch (<0.35 µm), there is increasing demand for the reliability of a gate oxide layer whose depth is continuously decreased. In the techniques of substituting for a conventional oxide layer, adding a small amount of nitrogen into the gate oxide layer to form a nitrided oxide (oxynitride) layer is most often studied. This is because the oxynitride layer not only keeps extremely good interface characteristics between a silicon oxide layer and a silicon substrate, but also has greater ability to resist electricity compared with silicon oxide. The main efficacy of the oxynitride layer is to restrain a boron-penetrating effect in a p-type transistor, and to decrease the aggravation of hot carriers in the p-type transistor. For example, when the oxynitride layer is utilized to control an interface between a polysilicon gate and an oxide layer, the boron-penetrating effect is noticeably restrained and the reliability of the oxide layer is maintained. Otherwise, when the oxynitride layer is utilized to control an interface between an oxide layer and a silicon substrate, there is a better defense against the effects of hot carrier passage. However, the degree of improvement as described above depends on the variation in the Si—N bonding appearance, and depends on the number of nitrogen atoms since too many nitrogen atoms will deteriorate the mobility of the carriers and generate oxide charges.

The number of nitrogen atoms in the oxynitride layer is closely related to various nitride treatments. With reference to the methods of growing the oxynitride layer in the present literature, they are concluded hereinafter. (1) Grow or anneal a gate oxide layer in a $N_2O$ or NO atmosphere. (2) Dope $N_2^+$ or $N^+$ into a substrate and then grow a gate oxide layer. (3) Perform a thermal nitridation on a substrate and then grow a gate oxide layer. (4) Perform a downstream plasma nitridation. (5) Deposit silicon nitride by jet vapor deposition (JVD) to form a gate dielectric layer. Owing to the likelihood of integrated circuit (IC) developing toward system-on-chip (SOC) configurations in the future, the method of growing the oxynitride layer on the nitride-dopant substrate which can grow many gate oxide layers of varied depths to fit the demand for different circuit devices is receiving considerable industry attention.

Additionally, fluorine, like nitrogen, is also usually used in ICs processing. As disclosed in literatures, appropriately doping the fluorine ion into the polysilicon gate and then performing a high-temperature drive-in process can diffuse the fluorine ion to a $Si/SiO_2$ interface and thereby effectively resist the hot carrier effect. It is believed that the Si—F bonding formed by bonding the fluorine and the dangling bonds of the silicon to have stronger bonding energy (5.73 ev) than that of Si—O, Si—Si and Si—H (3.18 ev) is the main mechanism responsible for effectively resisting the stress of the hot carriers. However, if excess fluorine atoms are doped, the excess fluorine atoms will substitute for more Si—O bondings to make great non-bonding oxygen atoms move toward the $Si/SiO_2$ interface. This promotes the formation of an interface trap and causes more defects when hot carriers enter. Also, the stress-releasing effect is reduced to cause a decline in the characteristics of the device. Moreover, the fluorine atoms doped in the polysilicon will speed up the boron-penetrating effect to make boron penetrate the gate oxide layer and the substrate, thereby causing a decline in the characteristics of the device, such as a reduction in an absolute value of threshold voltage ($V_{th}$) or a drift in flat band voltage ($V_{fb}$). Accordingly, a fluoride oxide layer is not popularly applied to ICs processing.

In addition, as ICs processing changes, dimensions of transistor devices are decreasing as the demand for device reliability increases. The diverse plasma processes applied to ICs production lines inflict latent destruction on semiconductor devices. Also, the increasingly complicated circuit wiring that plays the role of collecting the antenna intensifies the destruction caused by the plasma. The problem of the decrease in the yield and reliability of ICs products caused by the plasma, what is called the antenna effect, demands further study.

SUMMARY OF THE INVENTION

The object of the present invention is to solve the above-mentioned problems and provide a method of combining the nitride treatment and fluoride treatment to form a gate oxide layer with improved ability to resist process damage.

To achieve the above-mentioned object, the method comprises the steps of: providing a silicon substrate on which an isolating area and an element area are defined; growing a sacrificial oxide layer on the element area of the silicon substrate, and then doping nitrogen ions into the element area of the silicon substrate; removing the sacrificial oxide layer; growing an oxide layer on the silicon substrate in an oxygen atmosphere, wherein nitrogen ions inside the silicon substrate enters the oxide layer to become a nitrogen-containing gate oxide layer; depositing a polysilicon layer; performing a gate doping process on the polysilicon layer; performing a fluorine ion implantation on the polysilicon layer; and performing a high-temperature tempering procedure.

An advantage of the present invention is that its method combines the nitride treatment and the fluoride treatment to improve the reliability of the gate oxide layer. Also, the process is simple, practical, and compatible with ICs processing without requiring extra process or the fabrication of additional masks. Furthermore, the fluoride oxynitride layer fabricated in the present invention can be applied to the p-type device to improve the reliability of the gate oxide layer and prevent the p-type device being damaged by the boron-penetrating effect. Since nitrogen implantation is applied to the SOC technique, the range of potential industry applications is growing daily.

This and other objectives of the present invention will no doubt become obvious to those of ordinary skill in the art after having read the following detailed description of the preferred embodiment which is illustrated in the various figures and drawings.

BRIEF DESCRIPTION OF THE DRAWINGS

The present invention will become more fully understood from the detailed description given herein below and the accompanying drawings, given by way of illustration only and thus not intended to be limitative of the present invention.

DETAILED DESCRIPTION OF THE INVENTION

First Embodiment

Figure 1A:
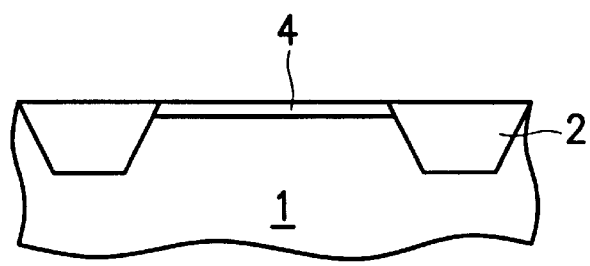
FIG. 1A to FIG. 1G are schematic diagrams of a method of forming a fluoride oxynitride according to the present invention.
Figure 1B:
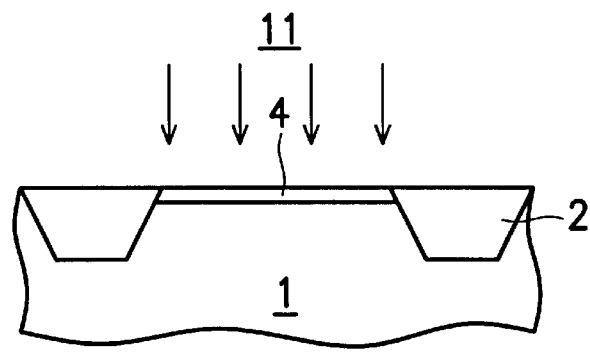

Please refer to FIG. 1A to FIG. 1G. FIG. 1A to FIG. 1G are schematic diagrams of a method of forming a fluoride oxynitride according to the present invention. As shown in FIG. 1A, a silicon substrate 1 comprises an isolating area 2, an element area 3 and a sacrificial oxide layer 4. The isolating area 2 is formed by a local oxidation (LOCOS) method or a shallow trench isolating (STI) method. In accordance with the request in subsequent processes, the sacrificial oxide layer 4 with a depth of 5~30 nm is formed on the element area 3 by a thermal oxidation method or a chemical vapor deposition method. As shown in FIG. 1B, the nitrogen ion ($N^+$ or $N_2^+$) 11 is doped into the silicon substrate 1 by an ion implantation method. Because the two steps of forming the sacrificial oxide layer 4 and doping the nitrogen ion are compatible with the threshold adjustment implant in the CMOS processing, there is no need to perform extra processes or utilize additional masks. The dosage and doping energy depend on the process requirements. In order to achieve a predetermined depth of a gate oxide layer, the dosage of the nitrogen ion can be adjusted in view of the application of the SOC technique. Generally, the dosage is about $1E13~1E16$ $cm^{-2}$.

Figure 1C:
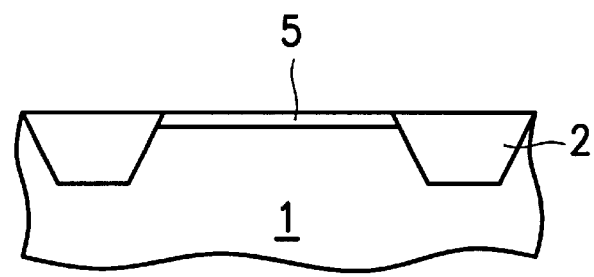
Figure 1D:
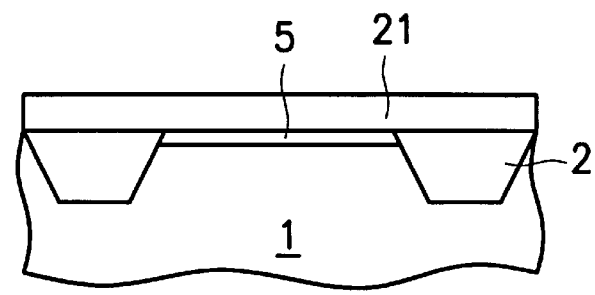
Figure 1E:
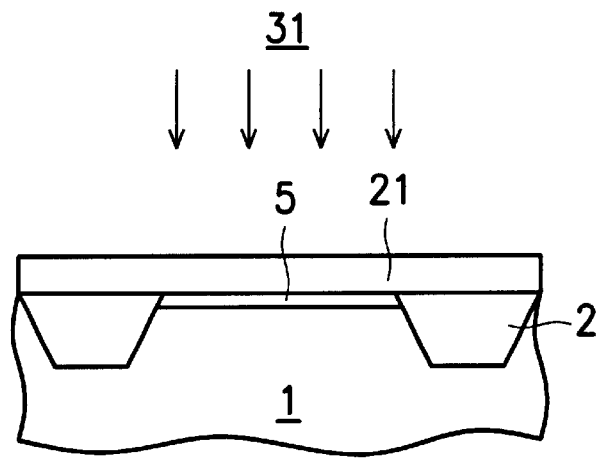
Figure 1F:
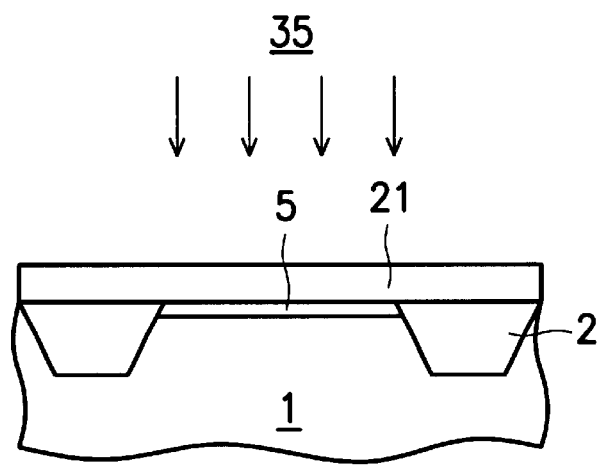
Figure 1G:
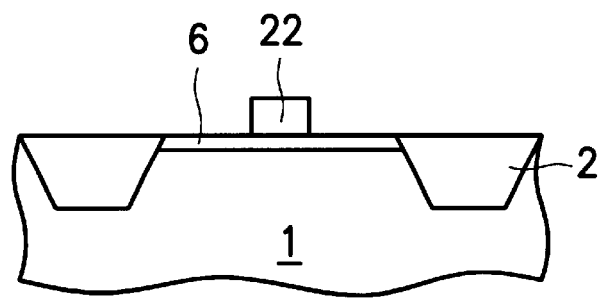

As shown in FIG. 1C, after removing the sacrificial oxide layer 4, an oxide layer is formed on the element area 3 in a thermal oxidation condition, wherein the nitrogen inside the silicon substrate 1 enters the oxide layer to make the oxide layer become an oxynitride layer 5. Next, as shown in FIG. 1D, a polysilicon gate layer 21 is deposited in a tube furnace by a low pressure chemical vapor deposition (LPCVD) method. Then, as shown in FIG. 1E and FIG. 1F, a gate doping process 35 and a fluorine ion implantation 31 are performed on the polysilicon gate layer 21, wherein the dosage in the fluorine ion implantation 31 is about $1E13~1E15$ $cm^{-2}$. There is no specific order in which the gate doping process 35 and the fluorine ion implantation 31 must be performed, nor is there a requirement for extra process or masks because they are compatible. Finally, as shown in FIG. 1G, the fluorine ion is driven into the oxynitride layer 5 by an implantation-activation tempering process to form a fluoride oxynitride layer 6. The polysilicon gate layer 21 is then etched to define a pattern of a gate 22 and thereby complete a transistor device.

Second Embodiment

The second embodiment is similar to the first embodiment, differing only in its method of forming the oxynitride layer 5. Compared with the first embodiment, the steps of doping $N^+$ or $N_2^+$ into the silicon substrate 1 and growing the oxide layer by thermal oxidation are omitted and replaced by the oxidization of the silicon substrate 1 in a $N_2O$ or $O_2$ condition. This immediately forms the oxynitride layer 5 on the silicon substrate 1.

Figure 2A:
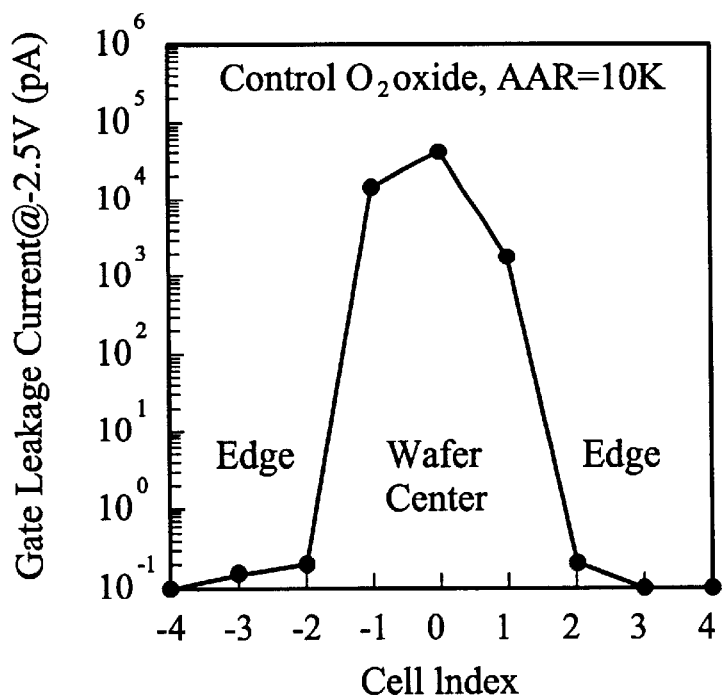
FIG. 2A and FIG. 2B show a study result of the resistance of divers oxidation techniques to the charge-effect of the plasma process.
Figure 2B:
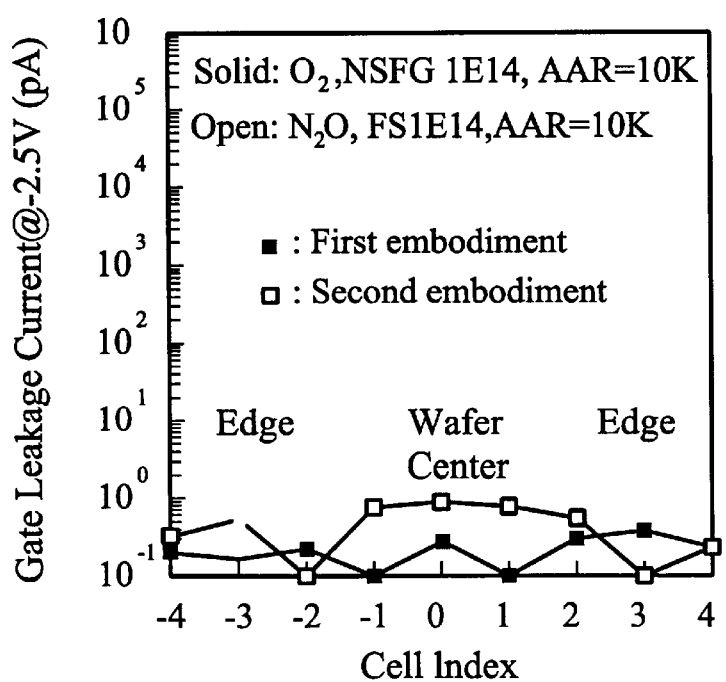

By experimental proof, the methods of the first and second embodiments endow the gate oxide layer with an improved ability to resist process damage. With reference to FIG. 2, typical data shows a study result of the resistance of divers oxidation techniques to the charge-effect of the plasma process (the so-called antenna effect). In the study, the depth of the oxide layer on the MOS device is controlled at about 36 Å, and a metal antenna is suspended on the gate of the device, wherein the ratio between the size of the metal antenna and the size of the element area is 10000. After exposure to oxygen plasma, the gate leakage current of the device is measured at $Vg=-2.5V$. As shown in FIG. 2A, with regard to a traditional oxide layer, the plasma seriously damages the metal antenna positioned in the center of a chip, thereby several net charges accumulate on the metal antenna, deteriorating the oxide layer and rapidly increasing the gate leakage current. As shown in FIG. 2B, with regard to the oxide layer with nitride treatment and fluoride treatment, the increase in the gate leakage current is not obvious. The main reason is believed to be that the nitrogen and fluorine dopants can restrain the antenna effect to prevent the oxide layer from deteriorating. Additionally, if only one of the nitride treatment or the fluoride treatment is applied to the experiment, the improvement is still far from that exhibited in the present invention. Although the actual reason is undergoing research, the related results proved by repeat experiments are consistent and identical. This indicates that the present invention possesses practicability and importance.

The present invention uses the method combining the nitride treatment and the fluoride treatment to improve the reliability of the gate oxide layer. The process is simple, practical, and compatible with ICs processing without requiring extra process or the fabrication of additional masks. Furthermore, the fluoride oxynitride layer fabricated in the present invention can be applied to the p-type device to improve the reliability of the gate oxide layer and prevent the p-type device from the boron-penetrating effect's damage. Since nitrogen implantation is applied to the SOC technique, the range of potential industry applications is growing daily.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a gate, oxide layer with an improved ability to resist process damage, comprising:
   (a) providing a silicon substrate on which an isolating area and an element area are defined;
   (b) growing a sacrificial oxide layer on the element area of the silicon substrate, and then doping nitrogen ions into the element area of the silicon substrate;
   (c) removing the sacrificial oxide layer;
   (d) growing an oxide layer on the silicon substrate in an oxygen atmosphere, wherein the nitrogen ions inside the silicon substrate enter the oxide layer to become a nitrogen-containing gate oxide layer;
   (e) depositing a polysilicon layer;
   (f) performing a gate doping process on the polysilicon layer;
   (g) performing a fluorine ion implantation on the polysilicon layer; and
   (h) performing a high-temperature tempering procedure.

2. The method of claim 1, wherein the sacrificial oxide layer is formed by a thermal oxidation method and has a depth between 5 nm and 30 nm.

3. The method of claim 1, wherein the type of the nitrogen ion is $N^+$ or $N_2^+$, the dosage of the nitrogen ion is $1E13~1E16$ $cm^{-2}$, and the doping energy is 1~50 KeV.

4. The method of claim 1, wherein the depth of the nitrogen-containing gate oxide layer is 1.5~10 nm.

5. The method of claim 1, wherein the polysilicon layer is formed by a low pressure chemical vapor deposition (LPCVD) method.

6. The method of claim 1, wherein the gate doping process is performed by an in-situ method of an ion implantation method.

7. The method of claim 6, wherein the gate doping process employs n-type phosphorous or arsenic as the dopant.

8. The method of claim 6, wherein the gate doping process employs p-type boron as the dopant.

9. The method of claim 1, wherein the fluorine ion implantation employs a dosage between 1E13 to 1E15 $cm^{-2}$ and a doping energy between 1 KeV to 50 KeV.

10. The method of claim 1, wherein the high-temperature tempering procedure is performed in a tube furnace at a temperature between 800 to 900° C. during a period time between 10 to 60 minutes.

11. The method of claim 1, wherein the high-temperature tempering procedure is performed in a rapidly tempering furnace at a temperature between 900 to 1050° C. during a period time between 10 seconds to 10 minutes.

* * * * *